(12) United States Patent
Rollin et al.

(10) Patent No.: US 7,755,174 B2
(45) Date of Patent: Jul. 13, 2010

(54) INTEGRATED ELECTRONIC COMPONENTS AND METHODS OF FORMATION THEREOF

(75) Inventors: Jean-Marc Rollin, Blacksburg, VA (US); David W. Scherrer, Radford, VA (US)

(73) Assignee: Nuvotonics, LLC, Radford, VA (US)

( * ) Notice: Subject to any disclaimer, the term of this patent is extended or adjusted under 35 U.S.C. 154(b) by 4 days.

(21) Appl. No.: 12/077,547

(22) Filed: Mar. 20, 2008

(65) Prior Publication Data

US 2008/0240656 A1 Oct. 2, 2008

Related U.S. Application Data

(60) Provisional application No. 60/895,979, filed on Mar. 20, 2007.

(51) Int. Cl.
*H01L 29/40* (2006.01)
(52) U.S. Cl. ........................... 257/664; 333/243
(58) Field of Classification Search .................. 257/664
See application file for complete search history.

(56) References Cited

U.S. PATENT DOCUMENTS

| 4,673,904 | A | 6/1987 | Landis et al. |
|---|---|---|---|
| 5,990,768 | A | 11/1999 | Takahashi et al. |
| 6,466,112 | B1 | 10/2002 | Kwon et al. |
| 7,012,489 | B2 | 3/2006 | Sherrer et al. |
| 7,148,772 | B2 * | 12/2006 | Sherrer et al. ............... 333/243 |
| 7,239,219 | B2 | 7/2007 | Brown et al. |
| 7,259,640 | B2 | 8/2007 | Brown et al. |
| 2002/0075104 | A1 | 6/2002 | Kwon et al. |
| 2003/0222738 | A1 | 12/2003 | Brown et al. |
| 2004/0263290 | A1 | 12/2004 | Sherrer et al. |

FOREIGN PATENT DOCUMENTS

| CA | 2055116 | 5/1992 |
|---|---|---|
| EP | 0 485 831 | 5/1992 |

OTHER PUBLICATIONS

European Search Report of corresponding European Patent Application No. 08 15 3144 mailed Jul. 2, 2008.

* cited by examiner

*Primary Examiner*—Thien F Tran
(74) *Attorney, Agent, or Firm*—Sherr & Vaughn, PLLC

(57) ABSTRACT

Provided are integrated electronic components which include a waveguide microstructure formed by a sequential build process and an electronic device, and methods of forming such integrated electronic components. The microstructures have particular applicability to devices for transmitting electromagnetic energy and other electronic signals.

8 Claims, 8 Drawing Sheets

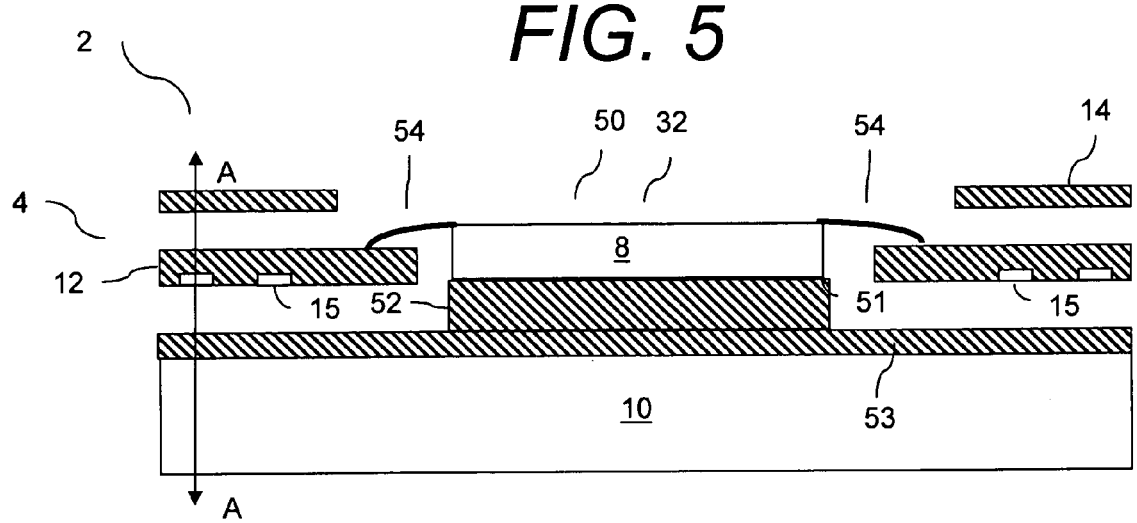
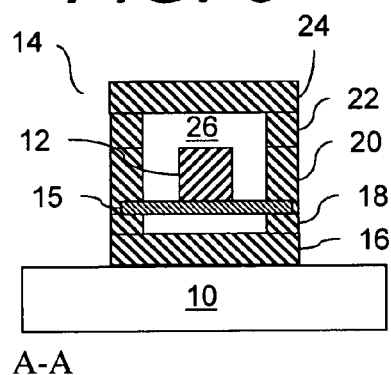

FIG. 7D
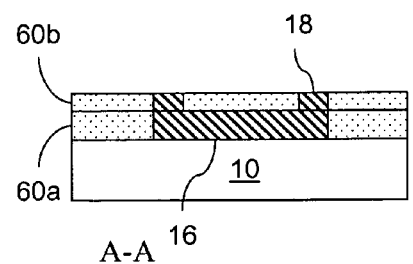
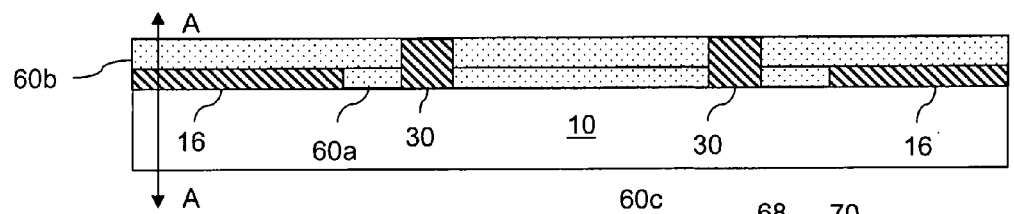
FIG. 7E
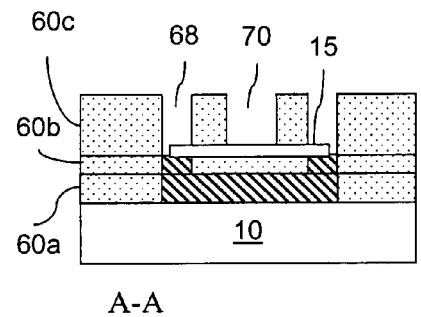
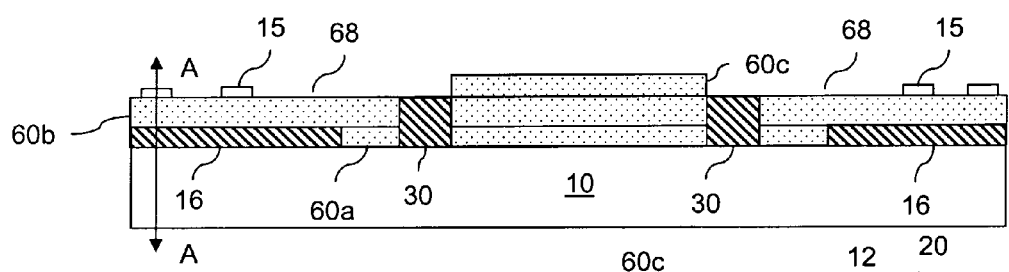
FIG. 7F
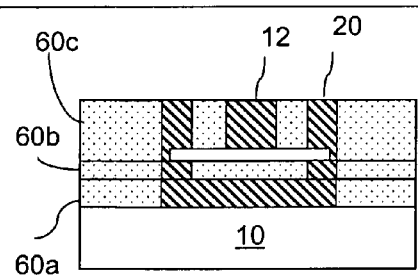
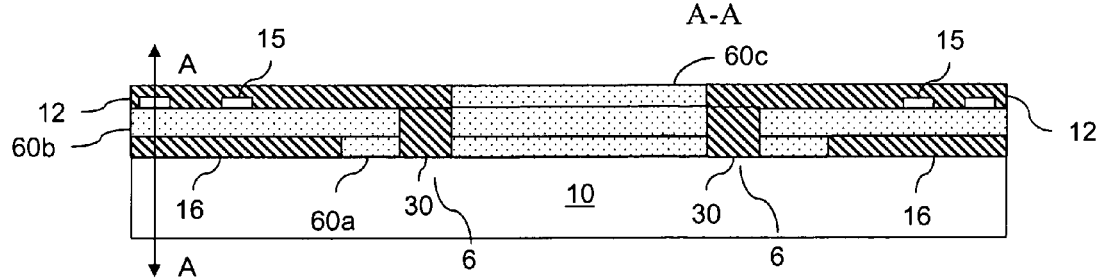

FIG. 7G
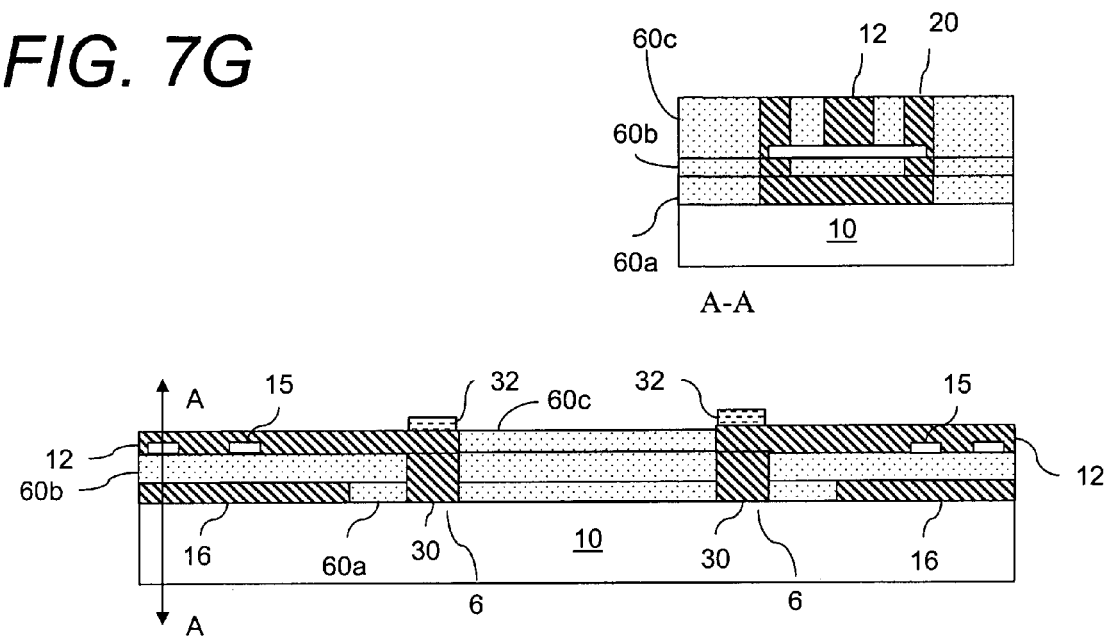
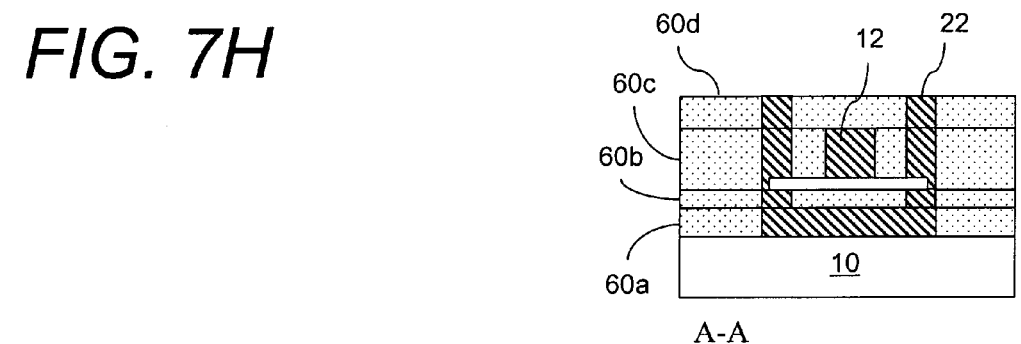
FIG. 7H
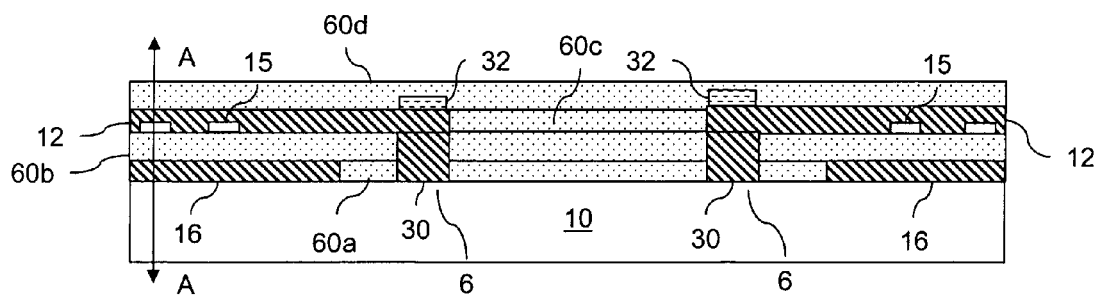

INTEGRATED ELECTRONIC COMPONENTS AND METHODS OF FORMATION THEREOF

This application claims the benefit of priority under 35 U.S.C. §119(e) to U.S. Provisional Application No. 60/895,979, filed Mar. 20, 2007, the entire contents of which are incorporated herein by reference.

This invention relates generally to microfabrication technology and, more specifically, to integrated electronic components which include a waveguide microstructure formed by a sequential build process and an electronic device. The invention also relates to methods of forming such integrated electronic components. The invention has particular applicability to devices for transmitting electromagnetic energy and other electronic signals.

The formation of three-dimensional microstructures by sequential build processes has been described, for example, in U.S. Pat. No. 7,012,489, to Sherrer et al (the '489 patent). The '489 patent discloses a coaxial transmission line microstructure formed by a sequential build process. The microstructure is formed on a substrate and includes an outer conductor, a center conductor and one or more dielectric support members which support the center conductor. The volume between the inner and outer conductors is gaseous or vacuous, formed by removal of a sacrificial material from the structure which previously filled such volume. The '489 patent discloses that a passive and/or active device may be bonded to the transmission line microstructure by formation of a thin layer of solder on exposed surfaces of the center and outer conductor. Coupling of an electronic device directly to the waveguide, however, limits designs and applications of the formed components. In this regard, the ability to couple electronic devices in a more flexible manner, for example, to allow the devices to be located apart from the waveguide end surface, would be desired.

A difficulty of microstructure connectivity with an electronic device is the delicate nature of the microstructures. The microstructures are formed from a number of relatively thin layers, with the center conductor being suspended in a gaseous or vacuous core volume within the outer conductor. Although periodic dielectric members are provided in the described microstructures to support the center conductor along its length, the microstructures are still susceptible to breakage and failure caused by excessive mechanical stresses. Such forces may be exerted through processes such as a direct chip attach to insufficiently supported micro-coaxial center conductors. In addition, improved methods to deal with electrical cross talk, thermal dissipation, and mechanical reliability of the attached chip would be beneficial.

There is thus a need in the art for improved integrated electronic components and for their methods of formation which would address one or more problems associated with the state of the art.

In accordance with a first aspect of the invention, provided are integrated electronic components which include: an electronic device; and a microstructure formed by a sequential build process, wherein the microstructure includes: a waveguide section comprising a plurality of waveguides, the waveguides each having a non-solid core volume within an outer conductor surrounding the core volume; and a transition structure coupling the waveguides to the electronic device.

In accordance with a further aspect of the invention, provided are methods of forming an integrated electronic component. The methods involve: providing an electronic device; disposing a plurality of layers over a substrate, wherein the layers include one or more of dielectric, conductive and sacrificial materials; and forming from the layers a microstructure which includes: a waveguide section comprising a plurality of waveguides, the waveguides each having a non-solid core volume within an outer conductor surrounding the core volume; and a transition structure coupling the waveguides to the electronic device. Exemplary aspects of the mechanical coupling include methods to provide stress relief between the electronic device and the microstructure to prevent attach failure due the CTE mismatch between the chip and the microstructure and to mitigate the effects of accumulated strain during repeated thermal cycling.

In accordance with further aspects of the invention, the microstructure may also be highly thermally coupled to the electronic device so as to act as a heat sink for the electronic device.

Other features and advantages of the present invention will become apparent to one skilled in the art upon review of the following description, claims, and drawings appended hereto.

The present invention will be discussed with reference to the following drawings, in which like reference numerals denote like features, and in which:

FIG. 5 illustrates a cross-sectional view of an exemplary integrated electronic component in accordance with a further aspect of the invention, in which an electronic device is mounted with an active surface facing upwards and the ports of the electronic device are attached by bond wires to the ports of the microstructure;

FIG. 6 illustrates a cross-sectional view of a waveguide microstructure taken along lines A-A of FIGS. 1-3 and 4A and 5; and FIG. 7A-K illustrates side-sectional and cross-sectional views of the exemplary integrated electronic component of FIG. 1 at various stages of formation in accordance with the invention.

Figure 1:
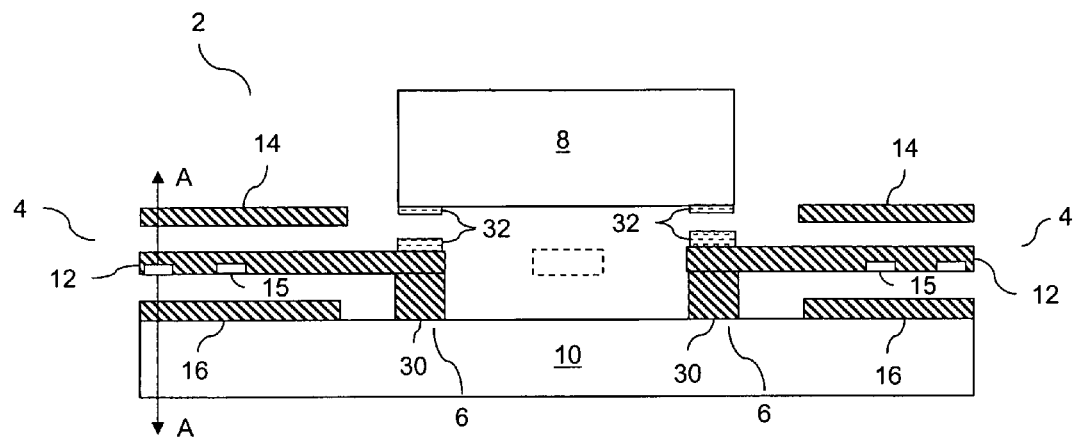
FIG. 1 illustrates a cross-sectional view of an exemplary integrated electronic component in accordance with the invention wherein the electronic component and electrical center conductors are supported from the substrate.

The exemplary processes to be described involve a sequential build to create three-dimensional microstructures. The term "microstructure" refers to structures formed by microfabrication processes, typically on a wafer or grid-level. In the sequential build processes of the invention, a microstructure is formed by sequentially layering and processing various materials and in a predetermined manner. When implemented, for example, with film formation, lithographic patterning, deposition, etching and other optional processes such as planarization techniques, a flexible method to form a variety of three-dimensional microstructures is provided.

The sequential build process is generally accomplished through processes including various combinations of: (a) metal, sacrificial material (e.g., photoresist) and dielectric coating processes; (b) surface planarization; (c) photolithography; and (d) etching or planarization or other removal processes. In depositing metal, plating techniques are particularly useful, although other metal deposition techniques such as physical vapor deposition (PVD), screen printing, and chemical vapor deposition (CVD) techniques may be used, the choice dependent on the dimensions of the coaxial structures and the materials deployed.

The exemplary embodiments of the invention are described herein in the context of the manufacture of transition structures for allowing electric connection between waveguide microstructures and electronic components. The electronic devices described can be any passive or active electrical, electromechanical, or other component with any number of I/O ports, where such a component is to be hybridly integrated into the microstructure to create a complete functioning device. The electronic devices are also referred to herein as "chips".

Waveguide microstructures of particular interest include hollow waveguide and coaxial transmission line microstructures. The devices of the invention find application, for example, in the satellite communications, telecommunications and data communications industry, in microwave amplifiers, in radar systems and in microwave and millimeter-wave passive and active devices and subsystems. It should be clear, however, that the technology described for creating microstructures is in no way limited to the exemplary structures or applications but may be used in numerous fields for microdevices such as in pressure sensors, rollover sensors, mass spectrometers, filters, microfluidic devices, heat sinks, electrical switches, hermetic packages, accelerometers, gyroscopes, wafer and grid level test probes, instrumentation, test and measurement equipment, surgical instruments, blood pressure sensors, air flow sensors, hearing aid sensors, image stabilizers, altitude sensors, autofocus sensors and actuators.

The invention can be used as a general method for microfabricating waveguides and electrical transitions for electrically and mechanically coupling electronic devices to the waveguides. The exemplified waveguide microstructures are useful for propagation of electromagnetic signals and power having a frequency, for example, of from below several MHz to 150 GHz or more, including millimeter waves and microwaves. The described waveguides and structures find further use in providing a simultaneous DC or lower frequency voltage, for example, in providing a bias to the electronic devices.

The invention will now be described with reference to FIG. 1 which illustrates a cross-sectional view of an exemplary integrated electronic component 2 in accordance with the invention and FIG. 6 which is a cross-sectional view taken along line A-A of FIG. 1. The integrated electronic component includes waveguide microstructures 4, transition structures 6 and an electronic device 8 to be attached. The exemplified waveguide microstructures are coaxial transmission lines formed by a sequential build process, and include a substrate 10, a center conductor 12, an outer conductor 14 disposed around and coaxial with the center conductor and one or more dielectric support members 15 for supporting the center conductor. Shown by dashed lines is one or more optional additional waveguide or other conductor such as a ground plane, DC bias lines, or connections used for heat removal. The outer conductor 14 includes a conductive base layer 16 forming a lower wall, conductive layers 18, 20, 22 forming sidewalls, and conductive layer 24 forming an upper wall of the outer conductor. The conductive layers forming the lower wall 16 and upper wall 24 may optionally be provided as part of a conductive substrate or a conductive layer on a substrate. The volume 26 between the center conductor and the outer conductor is a non-solid, for example, a gas such as air or sulphur hexafluoride, vacuous or a liquid. Optionally, the non-solid volume may be of a porous material such as a porous dielectric material formed, for example, from a dielectric material containing volatile porogens which may be removed with heating.

Figure 2:
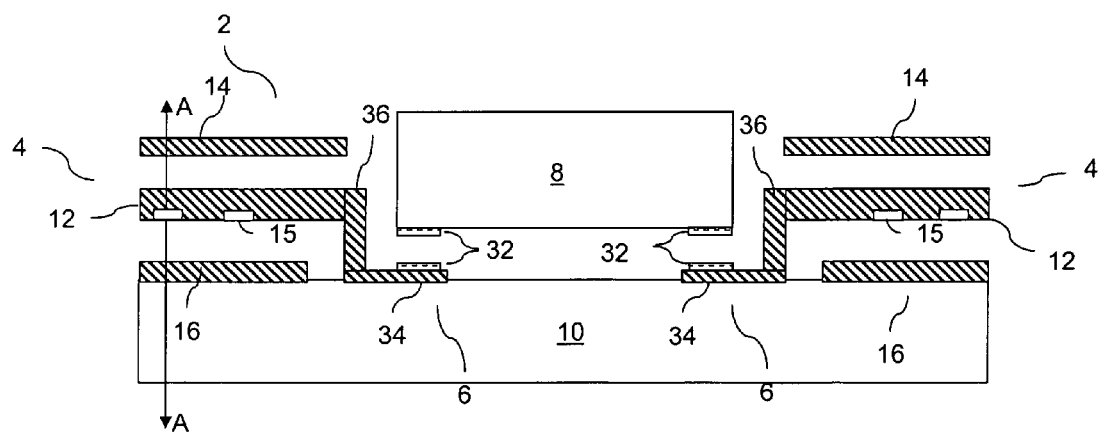
FIG. 2 illustrates a cross-sectional view of an exemplary integrated electronic component in accordance with a further aspect of the invention wherein the electronic component is mounted in close proximity to the substrate.
Figure 3:
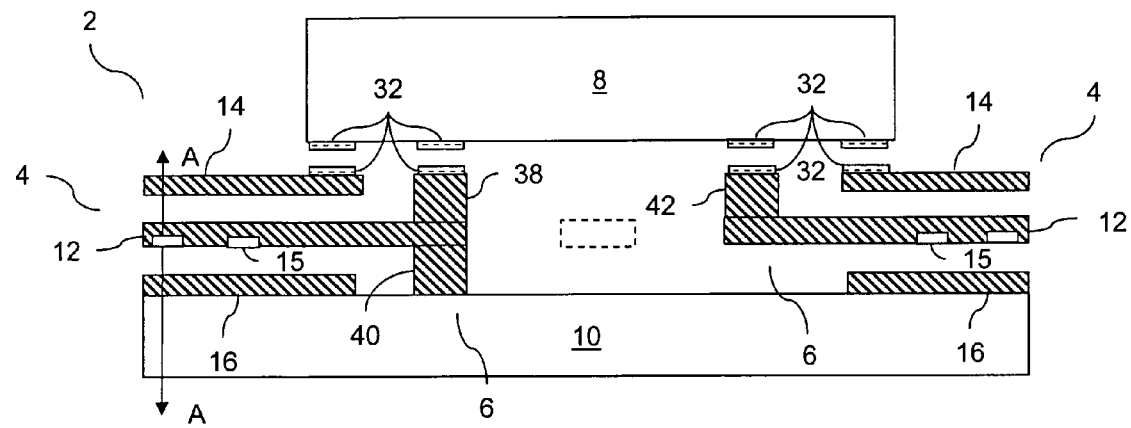
FIG. 3 illustrates a cross-sectional view of an exemplary integrated electronic component in accordance with a further aspect of the invention wherein the component is mounted on a surface of a microstructure.
Figure 4A:
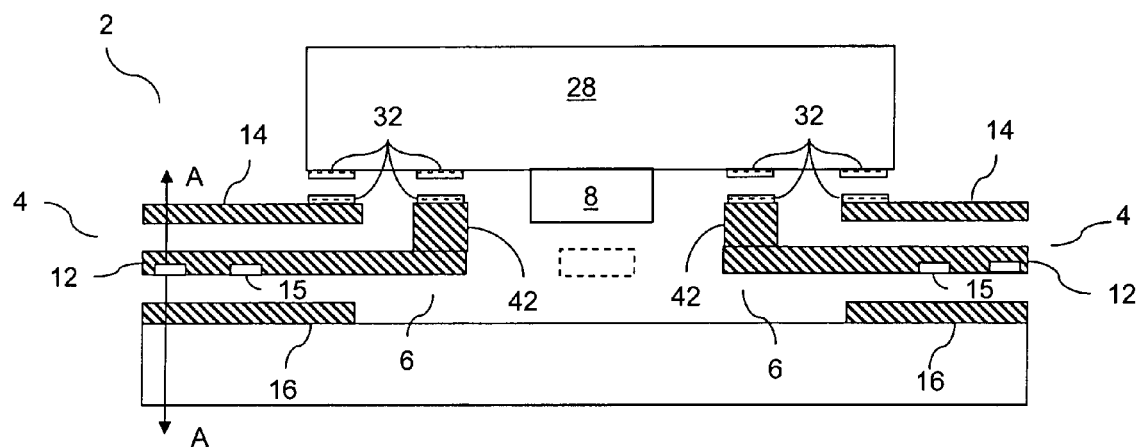
FIG. 4A illustrates a cross-sectional view of an exemplary integrated electronic component in accordance with a further aspect of the invention wherein the electronic component is mounted to a chip carrier substrate which is "flip-chip" mounted to the microstructure.

The transition structure 6 of the microstructure 4 provides a structure for mechanically and electrically coupling the electronic component 8 to the microstructure. The electronic component may be mechanically coupled directly to the transition microstructure, as shown in FIGS. 1-3, or attached to another substrate such as a chip-on-carrier 28 as shown in FIG. 4A. The transition structure and/or its surrounding features may additionally provide heat-sinking functionality for removal of heat from the devices. The transition microstructure may further provide for an increase or decrease in geometry from the waveguide in the height and/or width directions, allowing for coupling to the electronic component 8 without damaging the microstructure and/or to better match the dimension of the ports on the chip being mounted. For example, typical cross-sectional dimensions of the microcoax structure may be approximately 100 microns for the center conductor and 400 microns for the inner diameter of the outer conductor. Connection of a device such as a surface mounted power resistor may require an increase in the dimensions of the coaxial center conductors and correspondingly the outer conductors to better match the size of the connecting ports of the resistor. Connection to a microwave transistor, on the other hand, may require a decrease in the dimensions of the center conductors and outer conductors to better match the transistor ports which may be, for example, 25 micron or 50 micron mounting pads. When dealing with microwave frequencies, such transitions and their changes in shape such as tapers can be calculated to have the desired insertion loss, port isolation, and return loss using modeling software such as HFSS™ by Ansoft.

The transition microstructure 6 can take various forms as will be described. Persons skilled in the art, given the exemplary structures and description herein, will understand that designs other than those exemplified may be employed. As with other regions of the waveguide microstructure 4, the center conductor 12 is suspended in the transition microstructure 6 with a support structure. However, the load bearing or mechanical strain on the transition microstructure 6 can be significantly greater than that in other regions of the waveguide microstructure. As such, the design of a suitable support structure for the transition microstructure is needed. The transition microstructure 6 of FIG. 1 includes one or more support posts 30 on the substrate 10. The support posts provide mechanical support and stability for the center conductor and the electronic device 8 to be attached. The electronic device is to be joined to the transition microstructure at a first end which is typically coated with one or more solder layers 32 to allow bonding with the electronic device. The support posts 30 are disposed below and in supporting contact with an end portion of the center conductor 12. The support posts 30 are typically formed of the same conductive material as the waveguide, but may be formed in whole or in part from a dielectric material if electrical isolation from the substrate 10 is desired. Use of a metal or metal alloy for the support posts 30 allows for the post to function as a heat sink. In this regard, the microstructures and electronic devices can be capable of very high power outputs, for example, in excess of 100 watts in small chip-scale areas, causing significant temperatures which can adversely affect the conductive and dielectric materials making up the microstructures and the electronic devices.

The transition structures 6 described herein are able to withstand typical forces during attachment of the electronic device and in normal use. In addition, such posts, when being mechanically coupled to the substrate, can be designed to expand and contract dimensionally with a CTE more closely resembling the substrate CTE than the microstructure CTE. This is advantageous since substrates such as aluminum nitride, high resistivity silicon, silicon carbide, and the like can be chosen for both their thermal conductivity and electrical properties, and also so that the CTE of the substrate and that of the chip are more closely matched. This helps to mitigate the CTE mismatch normally found in a microstructure made of materials based on copper or nickel which do not typically match those of semiconductor chips that may be mounted to the microstructure. Not shown in FIG. 1, but optionally present in any of the described devices are ground plane structures below and/or above the chips to provide electrical shielding from radiation modes and to prevent cross-talk between the ports. However, such ground-plane shielding as present in the coaxial waveguide microstructures can be extended under and around the chip for this purpose.

FIG. 2 illustrates a cross-sectional view of an exemplary integrated electronic component 2 in accordance with a further aspect of the invention. In this structure, conductors 34 are provided on the upper surface of substrate 10, and are electrically connected to the waveguide microstructure center conductor 12 by conductive posts 36. Conductors 34 may be provided with one or more solder layers 32 as described above. This structure is advantageous in that it is able to withstand significant mechanical stresses during electronic device connection and in use, and the substrate may be chosen to closely match the coefficient of thermal expansion of the die to which it is attached. Such structures also benefit in the ability of the substrate to contain additional microelectronics on or in the substrate surface which can be electrically connected to the microstructure and the attached chip.

FIG. 3 illustrates a cross-sectional view of a further exemplary integrated electronic component 2 in accordance with the invention. In this structure, the electronic device 8 is joined to the transition structure and additionally is mechanically coupled to the waveguide outer conductors 14 with the use of one or more solder layers 32. Coupling to the structure in this manner provides additional thermal conductivity and support for the mechanical stresses encountered during electronic device connection and in use. Such a structure can also help provide electrical shielding and interface to CPW or microstrip waveguides that may be on the chip when attaching microwave devices. The illustrated transition microstructure 6 includes two types of transitions between the waveguide center conductor 12 and electronic device 8. The first is in the form of a support post which includes conductive segments 38, 40 in contact with and above and below the center conductor 12. The second includes a conductive segment 42 in contact with and above the center conductor. This combination of structures has been exemplified for purposes of illustration, and it should be clear that a single type of transition structure or any combination of types of such structures may be used. Advantages of this approach include improved thermal conductivity to the frame mounting region, improved control of electromagnetic radiation, and having a more rigid mounting frame to which the chip can be attached. Such a frame may be a continuous ring circumscribing the chip or may be a series of disconnected structures creating a frame, reducing the stress due to thermal expansion mismatch between the chip and the frame materials.

The choice of transition microstructures 6 depends, for example, on thermal conductivity and electrical performance requirements. Posts connected to the substrate exhibit improved thermal conductivity and mechanical stability characteristics, and can optionally serve as electrical connections to the substrate surface. Those not connected to the substrate have less parasitic capacitance and inductance which is an important consideration for broad band microwave devices as well as those operating at EHF frequencies. The illustrated transition structures can be electrically connected to a non-conductive, semiconductive or conductive substrate, or can be connected to mounting pads of microelectronics on the substrate. In addition, such transition structures may have a dielectric layer, which may be similar to the dielectric support members 15, or may be another dielectric that electrically isolates the transition structure from the substrate or from the electronic device. The dielectric layer may be disposed anywhere in the transition structure to prevent or minimize the electrical path or parasitics between the chip and the substrate.

Figure 4B:
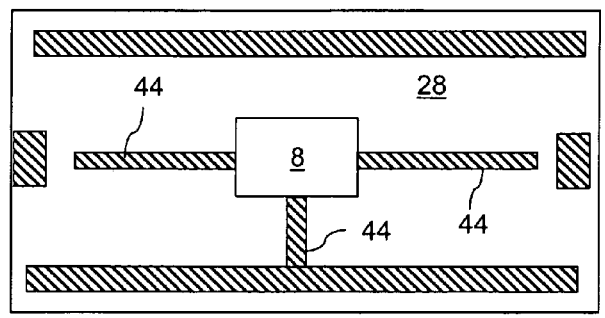
FIG. 4B illustrates a bottom-up view of the exemplary chip-on-carrier that becomes flip-chipped in FIG. 4A.

FIG. 4A illustrates a cross-sectional view of another exemplary integrated electronic component 2 which employs a chip 8 mounted to a carrier 28, for example, by flip-chip mounting. The chip carrier 28 is coupled to the transition microstructure 6 and may also be connected to the outer conductor 14 in a similar manner to that described with reference to FIG. 3. While the transition microstructure as illustrated includes structures as described above with reference to the second type of structure 42 in FIG. 3, it should be clear that in this and other of the exemplified devices, the transition structure is not to be limited to the illustrated structures. FIG. 4B illustrates a bottom-up view of the chip-carrier 28 of FIG. 4A. As shown, the chip-carrier includes conductive structures including conductors 44 for electrical connection as well as other optional conductive regions which may be used, for example, for bonding or heat-sinking functions.

While two or three connections are shown in cross-section, it should be clear that any number of connections can be made around a periphery, in multiple layers or as needed on the interior surfaces of the chip. Advantages of the chip carrier 28 include the ability to provide additional microelectronics and planar waveguide structures on the carrier, the ability to choose a carrier with a CTE more closely matching the chip mounted to it, the ability to choose a carrier with the desired thermal and electrical properties, and the ability to simplify the assembly process where, for example, precision placement of the chip is required or the bondpads for the chip are too small for directly mounting to the microstructure transitions. Other advantages of this approach, although not shown in the illustrated device, include the ability to remove heat from the chip from both sides if a thermal post is provided below the mounted chip. This is similar to the thermal and mechanical mounting structure described below with reference to FIG. 5.

In the integrated electronic components of FIGS. 3 and 4, mounting of the electronic component 8 to the upper surrounding frame or ground plane can be modified into lead-frame-like fingers or eliminated from the chip mounting region. In this case, as in FIG. 4A, the waveguide microstructure is not rigidly connected and the chip can be made to attach to the I/O ports of the microstructures in such a way as to provide mechanical flexibility by designing a spring into the I/O of the microstructures. The microstructure I/O can flex to compensate for the CTE mismatch that may occur between the chip and the microstructure.

FIG. 5 illustrates an exemplary integrated electronic component wherein an electronic device 8 is mounted with an active side 50 facing up. The ports of the electronic device 8 are attached by bond wires 54 to the ports of the microstructure. The electronic device in this case is mounted to a microstructured post or a lower surface 52 in the chip mounting region. The back side 51 of the electronic device is attached with solder or a thermally conductive adhesive to the mounting region below the device 52 formed in one or more layers, or may be directly attached to a substrate surface. In this case, the metal post provides for a solid mounting platform with good thermal conduction from the electronic device 8 to the microstructure and/or substrate. By mounting directly to the substrate instead of a microstructured post, any mismatch in CTE between the electronic device and the microstructure can be addressed by the choice of the substrate. The post 52 may be provided on one or more layers on the substrate 10 and attached to the rest of the microstructure. This may be beneficial, particularly if the microstructures are to be released from the substrate for providing structural support. If the microstructure is to remain attached to the substrate 10, the post may be disposed directly on the substrate and does not need to be connected to the rest of the microstructure. The height that the chip 8 mounts can be determined by thermal, electrical, and mounting design constraints. For example, for very small or thin die, it may be desirable to place the chip no deeper than required for the top of the die to be at least slightly above the top surface of the surrounding microstructure top surface. This ensures there is no interference between the vacuum collets typically used for die placement and the microstructure in the region surrounding the die mounting region. In the case of some microwave or mm-wave devices, minimizing the length and height difference between the I/O ports of the microstructures and the die is important to minimize parasitic capacitance and inductance. In this case, it may be desired to make the height of the I/O ports and the chip I/O ports more directly adjacent and more closely on the same plane. In this case, the chip may either be recessed to the plane of the microstructure I/O ports or the microstructure I/O ports may make vertical transitions to match the height of the mounted die.

The mounting of the electronic device can be accomplished by use of thin film solders deposited either on the post 52 or on the back side of the electronic device to be mounted. Alternatively, solder pre-forms or thermally conductive adhesives such as those containing silver may be used to attach the electronic device. If thermal and electrical conductivity are not a concern, other chip mounting methods such as epoxy die attach may be used. There are many known methods of mounting die that can be selected based on, for example, function, design, cost and machines available to do the placement.

The electrical connection in this embodiment is addressed by wedge or wire or beam-lead bonding 54 between the center conductors 12 and ground planes and the chip electrical connections on the top surface of the electronic device 8. An upper portion of the outer conductor 14 is recessed to allow these electrical connections. If the structures are formed in copper, typically the wire bonding regions may receive a gold or nickel overcoat to enhance ease of bonding of the wires.

Figure 7A:
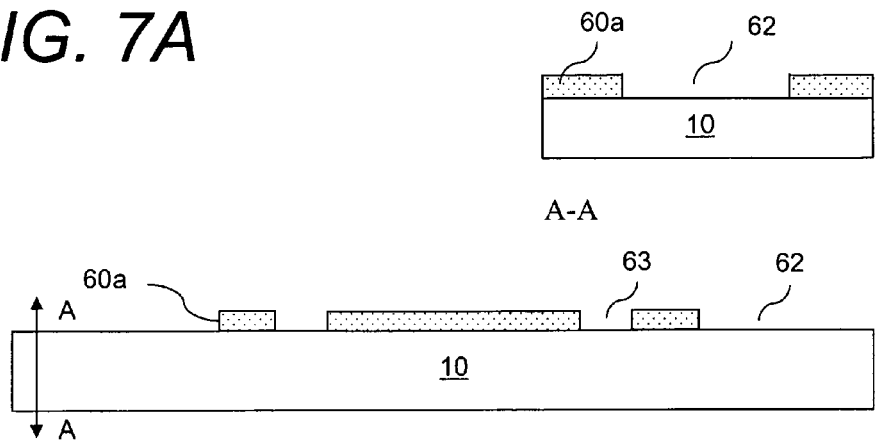

Exemplary methods of forming the coaxial transmission line microstructure of FIG. 1 will now be described with reference to FIG. 7A-K. The transmission line is formed on a substrate 10 as shown in FIG. 7A. The substrate may, for example, be constructed of a ceramic, a dielectric such as aluminum nitride, a semiconductor such as silicon, silicon-germanium or gallium arsenide, a metal such as copper or stainless steel, a polymer or a combination thereof. The substrate 10 can take the form, for example, of an electronic substrate such as a printed wiring board or a semiconductor substrate, such as a silicon, silicon germanium, or gallium arsenide wafer. Such substrate wafers may contain active devices and/or other electronics elements. The substrate may be selected to have an expansion coefficient similar to the materials used in forming the transmission line, and should be selected so as to maintain its integrity during formation of the transmission line. The surface of the substrate on which the transmission line is to be formed is typically substantially planar. The substrate surface may, for example, be ground, lapped and/or polished to achieve a high degree of planarity. If the substrate is not a suitable conductor, a conductive sacrificial layer may be deposited on the substrate. This can, for example, be a vapor deposited seed layer such as chrome and gold. Any of the methods of depositing conductive base layers for subsequent electroplating can be used.

A first layer 60a of a sacrificial photosensitive material, for example, a photoresist, may next be deposited over the substrate 10, and is exposed and developed to form patterns 62, 63 for subsequent deposition of the bottom wall of the transmission line outer conductor and support post lower portions of the transition structure, respectively. The patterns 62, 63 include channels in the sacrificial material, exposing the top surface of the substrate 10.

The sacrificial photosensitive material can be, for example, a negative photoresist such as Shipley BPR™ 100 or PHOTOPOSIT™ SN, and LAMINAR™ dry films, commercially available from Rohm and Haas Electronic Materials LLC. Particularly suitable photosensitive materials are described in U.S. Pat. No. 6,054,252. Suitable binders for the sacrificial photosensitive material include, for example: binder polymers prepared by free radical polymerization of acrylic acid and/or methacrylic acid with one or more monomers chosen from acrylate monomers, methacrylate monomers and vinyl aromatic monomers (acrylate polymers); acrylate polymers esterified with alcohols bearing (meth)acrylic groups, such as 2-hydroxyethyl (meth)acrylate, SB495B (Sartomer), Tone M-100 (Dow Chemical) or Tone M-210 (Dow Chemical); copolymers of styrene and maleic anhydride which have been converted to the half ester by reaction with an alcohol; copolymers of styrene and maleic anhydride which have been converted to the half ester by reaction with alcohols bearing (meth)acrylic groups, such as 2-hydroxyethyl methacrylate, SB495B (Sartomer), Tone M-100 (Dow Chemical) or Tone M-210 (Dow Chemical); and combinations thereof. Particularly suitable binder polymers include: copolymers of butyl acrylate, methyl methacrylate and methacrylic acid and copolymers of ethyl acrylate, methyl methacrylate and methacrylic acid; copolymers of butyl acrylate, methyl methacrylate and methacrylic acid and copolymers of ethyl acrylate, methyl methacrylate and methacrylic acid esterified with alcohols bearing methacrylic groups, such as 2-hydroxyethyl (meth)acrylate, SB495B (Sartomer), Tone M-100 (Dow Chemical) or Tone M-210 (Dow Chemical); copolymers of styrene and maleic anhydride such as SMA 1000F or SMA 3000F (Sartomer) that have been converted to the half ester by reaction with alcohols such as 2-hydroxyethyl methacrylate, SB495B (Sartomer), Tone M-100 (Dow Chemical) or Tone M-210 (Dow Chemical), such as Sarbox SB405 (Sartomer); and combinations thereof.

Suitable photoinitiator systems for the sacrificial photosensitive compositions include Irgacure 184, Duracur 1173, Irgacure 651, Irgacure 907, Duracur ITX (all of Ciba Specialty Chemicals) and combinations thereof. The photosensitive compositions may include additional components, such as dyes, for example, methylene blue, leuco crystal violet, or Oil Blue N; additives to improve adhesion such as benzotriazole, benzimidazole, or benzoxizole; and surfactants such as Fluorad® FC-4430 (3M), Silwet L-7604 (GE), and Zonyl FSG (Dupont).

The thickness of the sacrificial photosensitive material layers in this and other steps will depend on the dimensions of the structures being fabricated, but are typically from 1 to 250 microns per layer, and in the case of the embodiments shown are more typically from 20 to 100 microns per strata or layer.

The developer material will depend on the material of the photoresist. Typical developers include, for example, TMAH developers such as the Microposit™ family of developers (Rohm and Haas Electronic Materials) such as Microposit MF-312, MF-26A, MF-321, MF-326W and MF-CD26 developers.

Figure 7B:
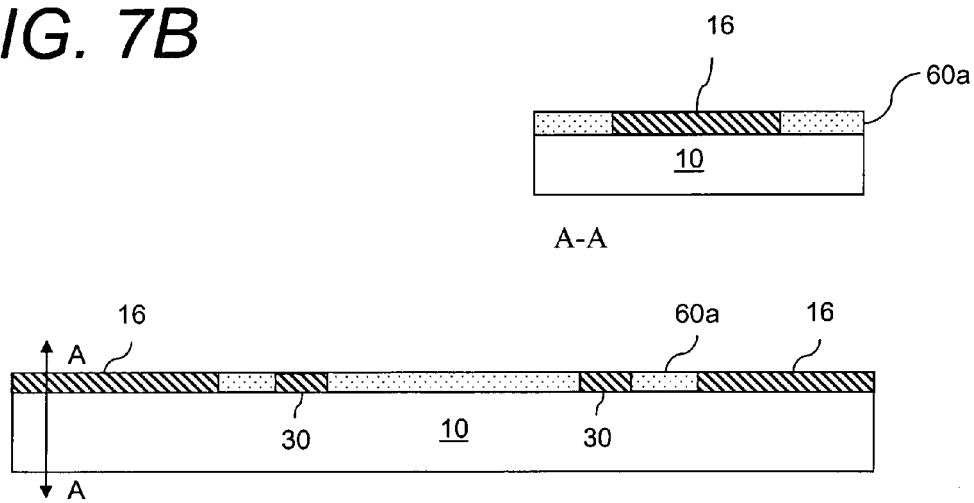

As shown in FIG. 7B, a conductive base layer 16 is formed over the substrate 10 and forms a lower wall of the outer conductor and a lower portion of the transition structure support post 30 in the final structure. The base layer 16 and support post 30 are typically formed of a material having high conductivity, such as a metal or metal-alloy (collectively referred to as "metal"), for example copper, silver, nickel, iron, aluminum, chromium, gold, titanium, alloys thereof, a doped semiconductor material, or combinations thereof, for example, multiple layers and/or multiple coatings of such materials in various combinations. The base layer may be deposited by a conventional process, for example, by plating such as electrolytic or electroless, or immersion plating, physical vapor deposition (PVD) such as sputtering or evaporation, or chemical vapor deposition (CVD). Plated copper may, for example, be particularly suitable as the base layer material, with such techniques being well understood in the art. The plating can be, for example, an electroless process using a copper salt and a reducing agent. Suitable materials are commercially available and include, for example, CIRCU-POSIT™ electroless copper, available from Rohm and Haas Electronic Materials LLC, Marlborough, Mass. Alternatively, the material can be plated by coating an electrically conductive seed layer on top of or below the photoresist. The seed layer may be deposited by PVD over the substrate prior to coating of the sacrificial material 60a. The use of an activated catalyst followed by electroless and/or electrolytic deposition may be used. The base layer (and subsequent layers) may be patterned into arbitrary geometries to realize a desired device structure through the methods outlined.

The thickness of the base layer 16 and the subsequently formed other walls of the outer conductor are selected to provide mechanical stability to the microstructure and to provide sufficient conductivity of the transmission line to provide sufficiently low loss. At microwave frequencies and beyond, structural influences become more pronounced, as the skin depth will typically be less than 1 μm. The thickness thus will depend, for example, on the specific base layer material, the particular frequency to be propagated and the intended application. In instances in which the final structure is to be removed from the substrate, it may be beneficial to employ a relatively thick base layer, for example, from about 20 to 150 μm or from 20 to 80 μm, for structural integrity. Where the final structure is to remain intact with the substrate 10, it may be desired to employ a relatively thin base layer which may be determined by the skin depth requirements of the frequencies used. In addition, a material with suitable mechanical properties may be chosen for the structure, and then it can be overcoated with a highly conductive material for its electrical properties. For example, nickel base structures can be overcoated with gold or silver using electrolytic, or preferably electroless plating process. Alternatively, the base structure may be overcoated with materials for other desired surface properties. Copper may be overcoated with electroless nickel and gold, or electroless silver to help prevent oxidation. Other methods and materials for overcoating may be deployed as are known in the art to obtain the target mechanical, chemical, electrical, corrosion-protective properties.

Appropriate materials and techniques for forming the sidewalls are the same as those mentioned above with respect to the base layer. The sidewalls are typically formed of the same material used in forming the base layer 16, although different materials may be employed. In the case of a plating process, the application of a seed layer or plating base may be omitted as here when metal in a subsequent step will only be applied directly over a previously formed, exposed metal region. It should be clear, however, that the exemplified structures shown in the figures typically make up only a small area of a particular device, and metallization of these and other structures may be started on any layer in the process sequence, in which case seed layers are typically used.

Surface planarization at this stage and/or in subsequent stages can be performed in order to remove any unwanted metal deposited on the top surface or above the sacrificial material, providing a flat surface for subsequent processing. Conventional planarization techniques, for example, chemical-mechanical-polishing (CMP), lapping, or a combination of these methods are typically used. Other known planarization or mechanical forming techniques, for example, mechanical finishing such as mechanical machining, diamond turning, plasma etching, laser ablation, and the like, may additionally or alternatively be used. Through surface planarization, the total thickness of a given layer can be controlled more tightly than might otherwise be achieved through coating alone. For example, a CMP process can be used to planarize the metal and the sacrificial material to the same level. This may be followed, for example, by a lapping process, which slowly removes metal, sacrificial material, and any dielectric at the same rate, allowing for greater control of the final thickness of the layer.

Figure 7C:
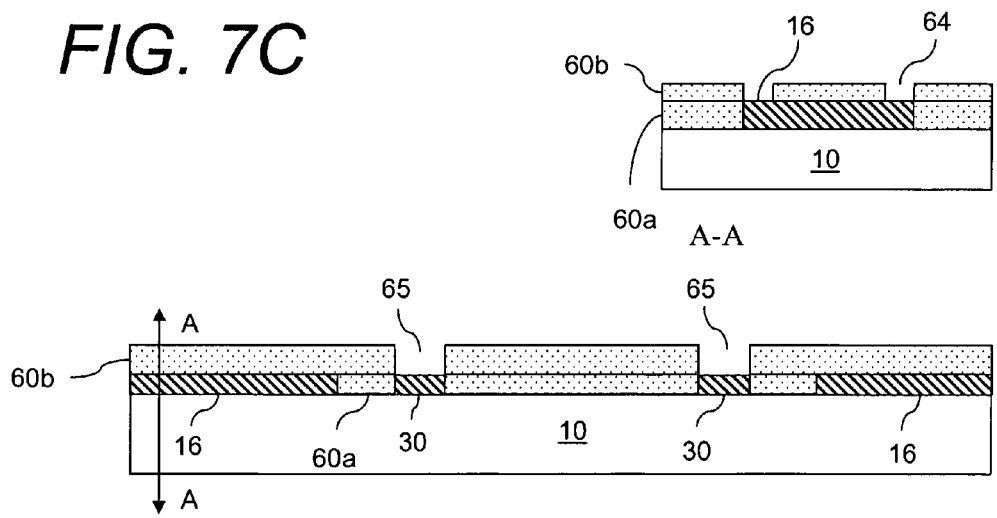

With reference to FIG. 7C, a second layer 60b of the sacrificial photosensitive material is deposited over the base layer 16 and first sacrificial layer 60a, and is exposed and developed to form a pattern 64 for subsequent deposition of lower sidewall portions of the transmission line outer conductor and pattern 65 for the upper portion of the transition structure support post 30. The pattern 64 includes a channel exposing the top surface of the base layer 16 where the outer conductor sidewalls are to be formed.

With reference to FIG. 7D, lower sidewall portions 18 of the transmission line outer conductor and the upper portion of the transition structure support post 30 are next formed. Appropriate materials and techniques for forming the sidewalls and support post upper portion are the same as those mentioned above with respect to the base layer 16 although different materials may be employed. In the case of a plating process, the application of a seed layer or plating base may be omitted as here when metal in a subsequent step will only be applied directly over a previously formed, exposed metal region. Surface planarization as described above may be conducted at this stage.

A layer of a dielectric material is next deposited over the second sacrificial layer 60b and the lower sidewall portions. In subsequent processing, support structures 15 are patterned from the dielectric layer to support the transmission line's center conductor to be formed. As these support structures 15 will lie in the core region of the final transmission line structure, the dielectric support layer should be formed from a material which will not create excessive losses for the signals to be transmitted through the transmission line. The material should also be capable of providing the mechanical strength necessary to support the center conductor along its length, including the end region in the transition structure. The material should further be relatively insoluble in the solvent used to remove the sacrificial material from the final transmission line structure. The material is typically a dielectric material selected from photosensitive-benzocyclobutene (Photo-BCB) resins such as those sold under the tradename Cyclotene (Dow Chemical Co.), SU-8 resist (MicroChem. Corp.), inorganic materials, such as silicas and silicon oxides, SOL gels, various glasses, silicon nitride ($Si_3N_4$), aluminum oxides such as alumina ($Al_2O_3$), aluminum nitride (AlN), and magnesium oxide (MgO); organic materials such as polyethylene, polyester, polycarbonate, cellulose acetate, polypropylene, polyvinyl chloride, polyvinylidene chloride, polystyrene, polyamide, and polyimide; organic-inorganic hybrid materials such as organic silsesquioxane materials; a photodefinable dielectric such as a negative acting photoresist or photoepoxy which is not attacked by the sacrificial material removal process to be conducted. In addition, combinations of these materials including composites and nano-composites of inorganic materials such as silica powders that are loaded into polymer materials may be used, for example to improve mechanical or chemical properties. Of these, SU-8 2015 resist is typical. It is advantageous to use materials which can be easily deposited, for example, by spin-coating, roller coating, squeegee coating, spray coating, chemical vapor deposition (CVD) or lamination. The dielectric material layer for the supports 15 is deposited to a thickness that provides for the requisite support of the center conductor without cracking or breakage. In addition, the thickness should not severely impact subsequent application of sacrificial material layers from the standpoint of planarity. While the thickness of the dielectric support layer will depend on the dimensions and materials of the other elements of the microstructure, the thickness is typically from 1 to 100 microns, for example, about 20 microns.

The dielectric material layer is next patterned using standard photolithography and developing techniques in the case of a photoimagable material to provide one or more dielectric support members 15 for supporting the center conductor of the transmission line, as shown in FIG. 7E. In the illustrated device, the dielectric support members 15 extend from a first side of the outer conductor to an opposite side of the outer conductor. In another exemplary aspect, the dielectric support members may extend from the outer conductor and terminate at the center conductor. In this case, one end of each of the support members 15 is formed over one or the other lower sidewall portion of the outer conductor and the opposite end extends to a position over the sacrificial layer 60b between the lower sidewall portions 18. The support members 15 are spaced apart from one another, typically at a fixed distance. The number, shape, and pattern of arrangement of the dielectric support members 15 should be sufficient to provide support to the center conductor while also preventing excessive signal loss and dispersion.

The dielectric support members 15 may be patterned with geometries allowing for the elements of the microstructure to be maintained in mechanically locked engagement with each other, reducing the possibility of their pulling away from the outer conductor. For example, the dielectric support members 15 may be patterned in the form of a "T" shape at each end (or an "I" shape) during the patterning process. During subsequent processing, the top portions of the T structures become embedded in the wall of the outer conductor and function to anchor the support members therein, rendering them more resistant to separation from the outer conductor. An anchor-type locking structure at one or both ends of the dielectric support members 15 may be used. Further, the dielectric support members may optionally include an anchor portion on a single end in an alternating pattern. Reentrant profiles and other geometries providing an increase in cross-sectional geometry in the depthwise direction are typical. In addition, open structures, such as vias, in the central region of the dielectric pattern may be used to allow mechanical interlocking with subsequent metal regions to be formed.

A third sacrificial photosensitive layer 60c is coated over the substrate, and is exposed and developed to form patterns 68, 70 for formation of middle sidewall portions of the transmission line outer conductor and the center conductor. The pattern 68 for the middle sidewall portion of the outer conductor is coextensive with the lower sidewall portions 18. The lower sidewall portions and the end of the dielectric support members overlying the lower sidewall portions are exposed by the pattern 68. The pattern 70 for the center conductor is a channel along the length of the microstructure. The pattern 70 exposes supporting portions of the center conductor dielectric support members 15. Conventional photolithography techniques and materials, such as those described above, can be used for this purpose.

As illustrated in FIG. 7F, the center conductor 12 and middle sidewall portions 20 of the outer conductor are formed by depositing a suitable metal material into the channels formed in the third sacrificial material layer 60c. Appropriate materials and techniques for forming the middle sidewall portions 20 and center conductor 12 are the same as those mentioned above with respect to the base layer 16 and lower sidewall portions 18, although different materials and/or techniques may be employed. Surface planarization may optionally be performed at this stage to remove any unwanted metal deposited on the top surface of the sacrificial material in addition to providing a flat surface for subsequent processing, as has been previously described and optionally applied at any stage.

With reference to FIG. 7G, to allow for bonding of the transition structure 6 to the electronic device 8, one or more solderable layers 32 may be formed on the bonding surfaces of the transition structure. The solderable layer may be formed in the same manner described above for the other conductive layers, using a further patterned layer of the sacrificial material followed by metallization, or other metallization technique such as by vapor deposition of the solder and use of a lift-off resist or shadow mask or by use of selective deposition, such as by the use of "solder-jet" printing may be used. The solderable layer 32 may include, for example, a Au—Sn solder or other solder material. The thickness of the solderable layers will depend on the particular materials involved, as well as the dimensions of the microstructure and of the connector. A thickness of from 5 to 25 microns is typical. Other techniques for affixing the electronic device to transition structure are envisioned, for example, use of conductive epoxies, nanoparticle-based adhesives, and anisotropic conductive adhesives.

With reference to FIG. 7H, a fourth sacrificial material layer 60d is deposited over the substrate, and is exposed and developed to form a pattern for subsequent deposition of upper sidewall portions 22 of the outer conductor. The pattern for the upper sidewall portion includes a channel coextensive with and exposing the middle sidewall portion. The upper sidewall portions 22 of the outer conductor are next formed by depositing a suitable material into the channels formed in the fourth sacrificial layer 60d. Appropriate materials and techniques for forming these structures are the same as those mentioned above with respect to the base layer 16 and other sidewall and center conductor portions. The upper sidewall portions 22 are typically formed with the same materials and techniques used in forming the base layer and other sidewalls and center conductor portions, although different materials and/or techniques may be employed. Surface planarization can optionally be performed at this stage to remove any unwanted metal deposited on the top surface of the sacrificial material in addition to providing a flat surface for subsequent processing.

Figure 7I:
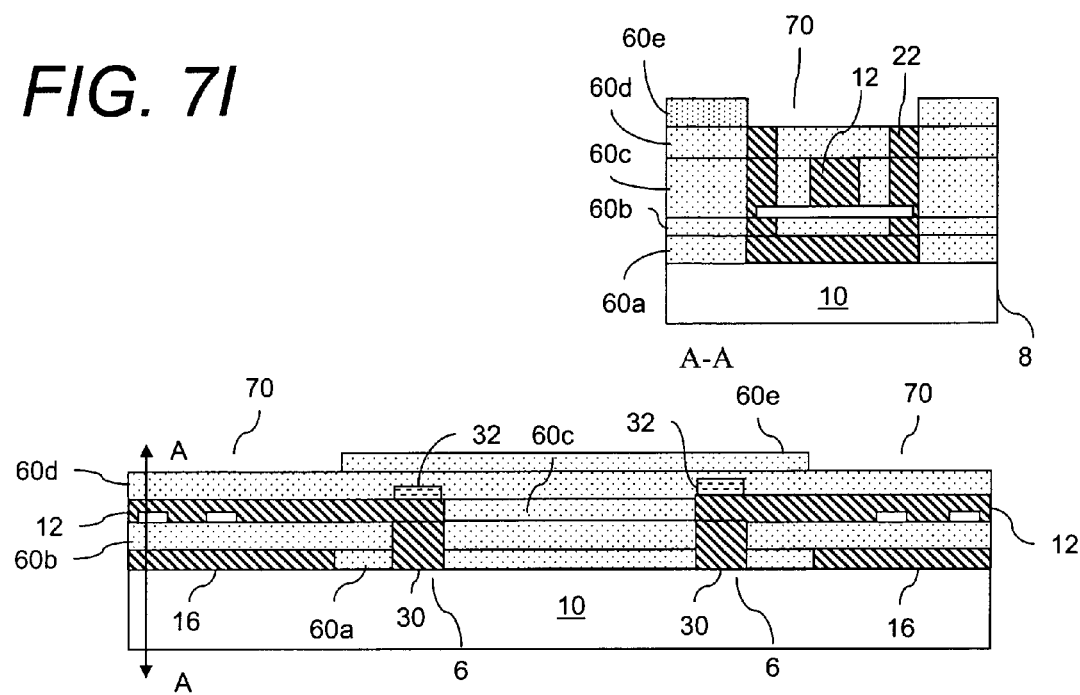
Figure 7J:
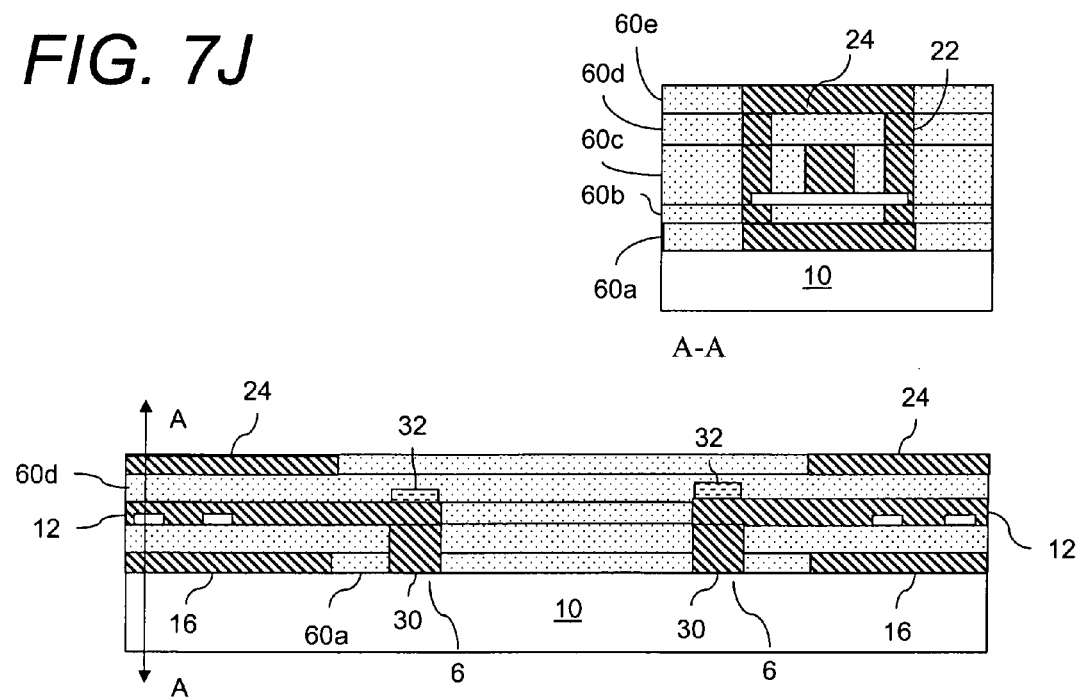

With reference to FIG. 7I, a fifth photosensitive sacrificial layer 60e is deposited over the substrate 10, and is exposed and developed to form patterns 70 for subsequent deposition of the top wall 24 of the transmission line outer conductor. The pattern for the top wall exposes the upper sidewall portions 22 and the fourth sacrificial material layer 60d therebetween. In patterning the sacrificial layer 60e, it may be desirable to leave one or more regions of the sacrificial material in the area between the upper sidewall portions. In these regions, metal deposition is prevented during subsequent formation of the outer conductor top wall. As described below, this will results in openings in the outer conductor top wall facilitating removal of the sacrificial material from the microstructure. Such openings are typically circular in shape, but may be squares, rectangular or another shape. Further, such openings may be included in any layer to improve the flow of solution to aid in removal of the sacrificial material 60a-e. The shape, size and locations of the openings are chosen based on design principles that include maintaining the desired mechanical integrity, maintaining sufficiently low radiation and scattering losses for the intended frequencies of operation, based on where the electrical fields are the lowest if being designed for low loss propagation which is typically the corners of the coaxial structure, and based on sufficient fluid flow to remove the sacrificial material With reference to FIG. 7J, the upper wall 24 of the outer conductor is next formed by depositing a suitable material into the exposed region over and between the upper sidewall portions 22 of the transmission line outer conductor. Metallization is prevented in the volume occupied by the sacrificial material pillars. Appropriate materials and techniques for forming these conductive structures are the same as those mentioned above with respect to the base layer and other sidewall and center conductor layers, although different materials and/or techniques may be employed. Surface planarization can optionally be performed at this stage.

With the basic structure of the transmission line being complete, additional layers may be added to create additional transmission lines or waveguides that may be interconnected to the first exemplary layer. Other layers such as solders may be added. Once the construction is complete, the sacrificial material remaining in the structure may next be removed. The sacrificial material may be removed by known strippers based on the type of material used. Suitable strippers include, for example: commercial stripping solutions such as Surfacestrip™ 406-1, Surfacestrip™ 446-1, or Surfacestrip™ 448 (Rohm and Haas Electronic Materials); aqueous solutions of strong bases such as sodium hydroxide, potassium hydroxide, or tetramethylammonium hydroxide; aqueous solutions of strong bases containing ethanol or monoethanolamine; aqueous solutions of strong bases containing ethanol or monoethanolamine and a strong solvent such as N-methylpyrrolidone or N,N-dimethylformamide; and aqueous solutions of tetramethylammonium hydroxide, N-methylpyrrolidone and monoethanolamine or ethanol.

In order for the material to be removed from the microstructure, the stripper is brought into contact with the sacrificial material. The sacrificial material may be exposed at the end faces of the transmission line structure. Additional openings in the transmission line such as described above may be provided to facilitate contact between the stripper and sacrificial material throughout the structure. Other structures for allowing contact between the sacrificial material and stripper are envisioned. For example, openings can be formed in the transmission line sidewalls during the patterning process. The dimensions of these openings may be selected to minimize interference with, scattering or leakage of the guided wave. The dimensions can, for example, be selected to be less than ⅛, 1/10 or 1/20 of the wavelength of the highest frequency used. The electrical impact of such openings can be calculated and can be optimized using software such as HFSS made by Ansoft, Inc, while the mechanical and fluid flow characteristics can be calculated using software such as Ansys™ MultiPhysics packages.

Figure 7K:
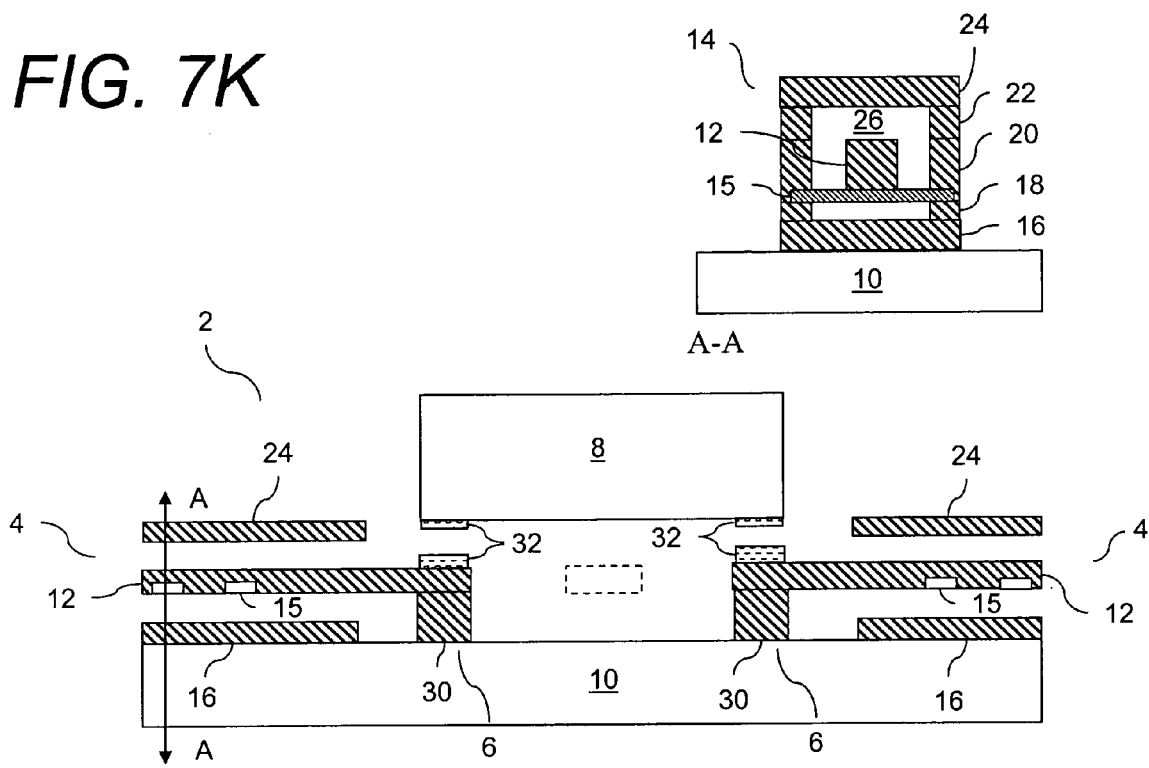

The final transmission device after removal of the sacrificial resist is shown in FIG. 7K. The volume previously occupied by the sacrificial material in and within the outer walls of the waveguide forms apertures in the outer conductor and forms the transmission line core 26. The core volume is typically occupied by a gas such as air. It is envisioned that a gas having better dielectric properties than air, for example, sulfur hexafluoride, may be used in the core. Optionally, a vacuum can be created in the core, for example, when the structure forms part of a hermetic package. As a result, a reduction in absorption from water vapor that may otherwise adsorb to the surfaces of the transmission lines can be realized. It is further envisioned that a liquid or vaporizing and condensing vapor can occupy and be transported through the core volume 26 between the center conductor and outer conductor, for example for cooling.

The electronic device 8 may next be attached to the transition structure 6. Such attachment may be conducted by aligning the respective mating surfaces and forming a solder joint by heating. A solder film such as described above or solder ball can be applied to either or both of the connector and microstructure mating surfaces. For example, a thin film solder such as Au—Sn (80:20) solder may be used to join the parts.

Bonding of the electronic device 8 to the transition structure 6 may optionally be conducted with the use of a conductive adhesive, for example, a silver-filled epoxy or nano-sized metal particle paste. Conductive adhesives are also available as an anisotropic conductive film or paste, wherein the conductive particle film or paste conduct only in one direction. The direction is determined by, for example, application of pressure or a magnetic field.

For certain applications, it may be beneficial to separate the final transmission line microstructure from the substrate to which it is attached. This may be done prior to or after attachment of the connector. Release of the transmission line microstructure would allow for coupling to another substrate, for example, a gallium arsenide die such as a monolithic microwave integrated circuits or other devices. Such release also allows structures such as connectors and antennae to be on opposite sides of the microstructure without the need to machine through a substrate material. Release of the structure from the substrate may be accomplished by various techniques, for example, by use of a sacrificial layer between the substrate and the base layer which can be removed upon completion of the structure in a suitable solvent or etchant that does not attack or is sufficiently selective to the structural materials chosen. Suitable materials for the sacrificial layer include, for example, photoresists, selectively etchable metals such as chrome or titanium, high temperature waxes, and various salts.

While the exemplified transmission lines include a center conductor formed over the dielectric support members 15, it is envisioned that they can be disposed within the center conductor such as in a split center conductor using a geometry such as a plus (+)-shape, a T-shape or a box. The support members 15 may be formed over the center conductor in addition or as an alternative to the underlying dielectric support members. Further, the support members 15 may take the form of a pedestal, providing support from any of the surrounding surfaces when placed between a center conductor and a surrounding surface.

The waveguides of the invention typically are square in cross-section. Other shapes, however, are envisioned. For example, other rectangular transmission lines can be obtained in the same manner the square transmission lines are formed, except making the width and height of the transmission lines different. Rounded transmission lines, for example, circular or partially rounded transmission lines can be formed by use of gray-scale patterning. Such rounded transmission lines can, for example, be created through conventional lithography for vertical transitions and might be used to more readily interface with external micro-coaxial conductors, to make connector interfaces, etc.

A plurality of transmission lines as described above may be formed in a stacked arrangement. The stacked arrangement can be achieved by continuation of the sequential build process through each stack, or by performing the transmission lines on individual substrates, separating transmission line structures from their respective substrates using a release layer, and stacking the structures. Such stacked structures can be joined by thin layers of solders or conductive adhesives. In theory, there is not a limit on the number of transmission lines that can be stacked using the process steps discussed herein. In practice, however, the number of layers will be limited by the ability to manage the thicknesses and stresses and if they are built monolithically, the resist removal associated with each additional layer. Coaxial structures have been shown in the example, however other structures such as hollow-core waveguides, antenna elements, cavities, and so forth can also be constructed using the described methods.

The integrated electronic components are typically manufactured on a wafer- or grid-level as a plurality of die. The microstructures and methods of the invention find use, for example, in: data and telecommunications in microwave and millimeter wave filters and couplers; aerospace and military in radar and collision avoidance systems and communications systems; automotive in pressure and rollover sensors; chemistry in mass spectrometers and filters; biotechnology and biomedical in filters, microfluidic devices, surgical instruments and blood pressure, air flow and hearing aid sensors; and consumer electronics in image stabilizers, altitude sensors, and autofocus sensors.

While these embodiments show various method of connecting electrical devices such as chip capacitors, resistors, and the like as well as active devices such as transistors, diodes, and integrated circuits, it should be clear there are other methods and combinations of these techniques that can be used. Solders or conductive adhesives can be applied to the microfabricated structures, to the chips or to both. Alternatively solid-state bonding methods such as gold-gold diffusion bonding could be employed for chip attach. Wick-stop layers such as nickel pads or dielectrics can be deployed to control the flow of the solders. Additional heat sinking can be deployed when heat generating chips are mounted by attaching them to the free-face, for example when a power amplifier chip is mounted flip-chip, an addition heat-sink can be connected to the back side. Finally it should be clear that such chips can be buried into many layers of these microstructures by mounting the chips and then mounting additional layers of microstructures on top. These layer may be interconnected electrically, thermally, and mechanically. Such an approach of stacking assembled layers to additional layers enables an approach to 3D circuits and "cubes" of electronics with many layers of interconnected functionality. When forming such structures from copper, the thermal conductivity is high solving the thermal management challenges typically of such 3D integration approaches.

While the invention has been described in detail with reference to specific embodiments thereof, it will be apparent to one skilled in the art that various changes and modifications can be made, and equivalents employed, without departing from the scope of the claims.

What is claimed is:

1. An integrated electronic component, comprising:
   an electronic device; and
   a microstructure formed by a sequential build process, wherein the microstructure comprises: a waveguide section comprising a plurality of waveguides, the waveguides each having a non-solid core volume within an outer conductor surrounding the core volume; and a transition structure coupling the waveguides to the electronic device.

2. The integrated electronic component of claim 1, wherein the transition structure provides a heat-sink function.

3. The integrated electronic component of claim 1, wherein the waveguides each comprise a center conductor and an outer conductor disposed around the center conductor, wherein the non-solid volume is disposed between the center conductor and the outer conductor.

4. The integrated electronic component of claim 1, wherein the electronic device comprises an active device.

5. The integrated electronic component of claim 1, wherein the electronic device comprises a passive device.

6. The integrated electronic component of claim 1, wherein the electronic device is flip-chip mounted to the transition structure.

7. The integrated electronic component of claim 1, wherein the transition structure comprises a pedestal disposed beneath the end portion of the center conductor.

8. The integrated electronic component of claim 1, wherein the transition structure comprises a plurality of metal posts connected to a backsurface of the electronic device, and a front surface of the electronic device is electrically connected to the waveguides.

* * * * *